US009923101B2

(12) United States Patent
Yen et al.

(10) Patent No.: US 9,923,101 B2
(45) Date of Patent: Mar. 20, 2018

(54) SEMICONDUCTOR STRUCTURE

(75) Inventors: Hsiao-Tsung Yen, Tainan (TW); Yu-Ling Lin, Taipei (TW); Chin-Wei Kuo, Hsinchu County (TW); Ho-Hsiang Chen, Hsinchu (TW); Chewn-Pu Jou, Hsinchu County (TW); Min-Chie Jeng, Taipei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 253 days.

(21) Appl. No.: 13/615,503

(22) Filed: Sep. 13, 2012

(65) Prior Publication Data

US 2014/0070366 A1    Mar. 13, 2014

(51) Int. Cl.
| H01L 29/94 | (2006.01) |
| H01L 29/66 | (2006.01) |
| H01L 21/66 | (2006.01) |
| H01L 27/06 | (2006.01) |
| H01L 49/02 | (2006.01) |
| H01L 23/48 | (2006.01) |
| H01L 23/58 | (2006.01) |

(52) U.S. Cl.
CPC ........ *H01L 29/94* (2013.01); *H01L 29/66181* (2013.01); *H01L 22/34* (2013.01); *H01L 23/481* (2013.01); *H01L 23/585* (2013.01); *H01L 27/0629* (2013.01); *H01L 28/60* (2013.01); *H01L 2924/0002* (2013.01)

(58) Field of Classification Search
None
See application file for complete search history.

(56) References Cited

U.S. PATENT DOCUMENTS

| 4,442,529 | A | * | 4/1984 | Ahuja et al. .................. 375/254 |
| 5,512,710 | A | * | 4/1996 | Schroeder .......... G01R 31/2818 174/262 |
| 5,786,630 | A | * | 7/1998 | Bhansali ........... H01L 23/49822 257/697 |
| 6,329,715 | B1 | * | 12/2001 | Hayashi .................. H01L 23/15 257/528 |
| 2001/0022365 | A1 | * | 9/2001 | Murade ............. H01L 29/78609 257/59 |
| 2001/0038115 | A1 | * | 11/2001 | Amanuma ..................... 257/303 |
| 2003/0200654 | A1 | * | 10/2003 | Omote ............. H01L 21/76898 29/852 |
| 2005/0013088 | A1 | * | 1/2005 | Horikawa ............... H01G 9/012 361/303 |
| 2005/0186934 | A1 | * | 8/2005 | Yajima et al. ................ 455/333 |
| 2005/0275004 | A1 | * | 12/2005 | Watanabe ...................... 257/296 |
| 2006/0001124 | A1 | * | 1/2006 | Ayazi .................... H01P 11/006 257/531 |
| 2007/0158818 | A1 | * | 7/2007 | Tang .................... H01L 21/4857 257/691 |
| 2009/0134500 | A1 | * | 5/2009 | Kuo ..................... H01L 23/481 257/659 |
| 2009/0146760 | A1 | * | 6/2009 | Reefman et al. ............. 333/184 |

(Continued)

*Primary Examiner* — Fazli Erdem
*Assistant Examiner* — Scott R Wilson
(74) *Attorney, Agent, or Firm* — Duane Morris LLP

(57) ABSTRACT

A semiconductor structure is provided. The semiconductor structure includes a floating substrate; and a capacitor grounded and connected to the floating substrate. A method of manufacturing a semiconductor structure is also provided.

15 Claims, 4 Drawing Sheets

(56) References Cited

U.S. PATENT DOCUMENTS

2011/0168782 A1* 7/2011 Bergler .............. H01L 23/5223
                                                    235/492
2012/0061795 A1* 3/2012 Yen et al. .................... 257/516
2013/0069440 A1* 3/2013 Marukame et al. .......... 307/104
2013/0264676 A1* 10/2013 Yang et al. .................. 257/508

* cited by examiner

SEMICONDUCTOR STRUCTURE

TECHNICAL FIELD

The present disclosure relates to a semiconductor structure, and more particularly to a semiconductor structure having a floating substrate.

BACKGROUND

The 3D IC technology has been widely used instead of the 2D IC technology due to its shorter total wirelength than that of the 2D IC technology. In the structure of the 3D IC, the floating substrate is a typical component where there are interconnections for conducting electrical signals. However, the coupling capacitance existing in the mentioned interconnections will result in a noticeable cross-talk effect. Therefore, there is a need to solve the above problem.

SUMMARY

In accordance with one aspect of the present disclosure, a semiconductor structure is provided. The semiconductor structure includes a floating substrate; and a capacitor grounded and connected to the floating substrate.

In accordance with another aspect of the present disclosure, a semiconductor structure is provided. The semiconductor structure includes a floating substrate; and a conductive piece spaced from the floating substrate to form a capacitor, wherein the conductive piece is grounded.

In accordance with one more aspect of the present disclosure, a method of manufacturing a semiconductor structure is provided. The method includes locating a coupled capacitor generating a noise signal; and grounding a formed capacitor to discharge therethrough the noise signal.

The above objects and advantages of the present disclosure will become more readily apparent to those ordinarily skilled in the art after reviewing the following detailed descriptions and accompanying drawings, in which:

DETAILED DESCRIPTION

Figure 1A:
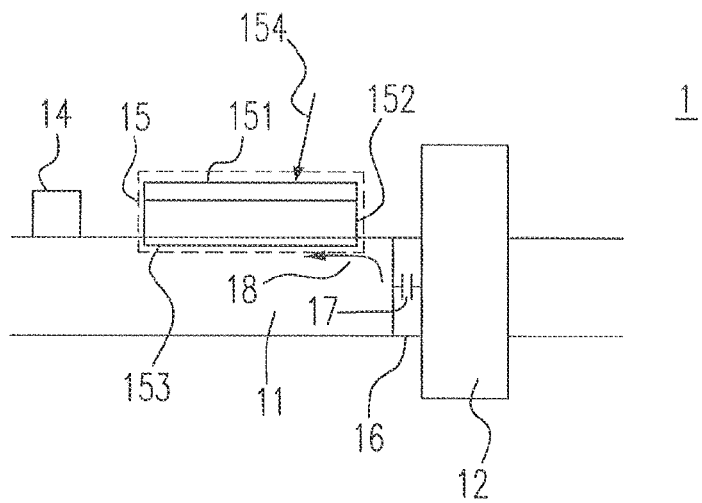
FIG. 1(a) is a diagram showing a semiconductor structure according to one embodiment of the present disclosure.

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to a device consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or methods may be combined in any suitable manner, as would be apparent to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

The invention will now be described by a detailed description of several embodiments. It is clear that other embodiments can be configured according to the knowledge of persons skilled in the art without departing from the true technical teaching of the present disclosure, the claimed invention being limited only by the terms of the appended claims.

Figure 1B:
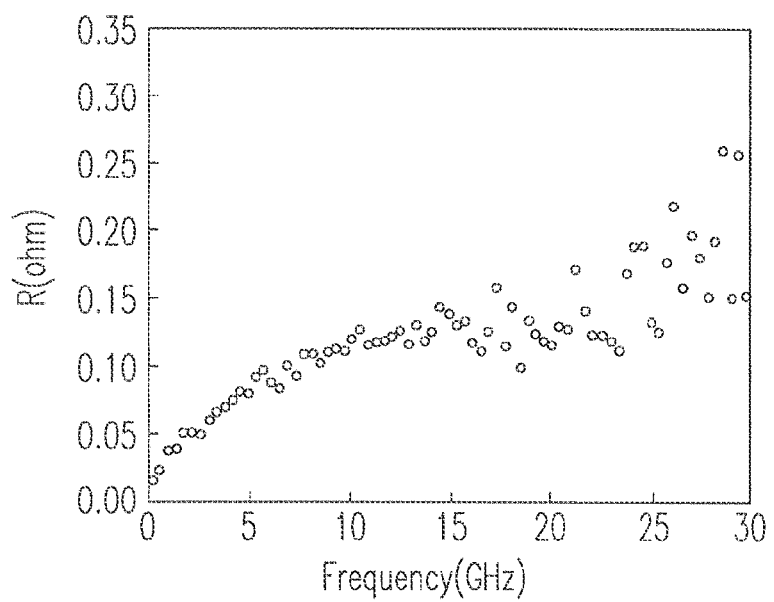
FIG. 1(b) is a diagram showing the measured resistance value versus the signal frequency.
Figure 1C:
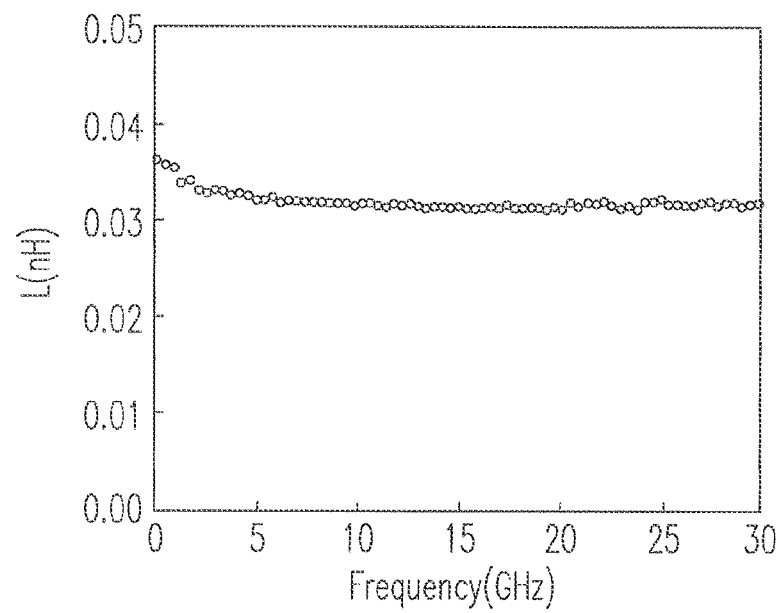
FIG. 1(c) is a diagram showing the measured inductance value versus the signal frequency.
Figure 1D:
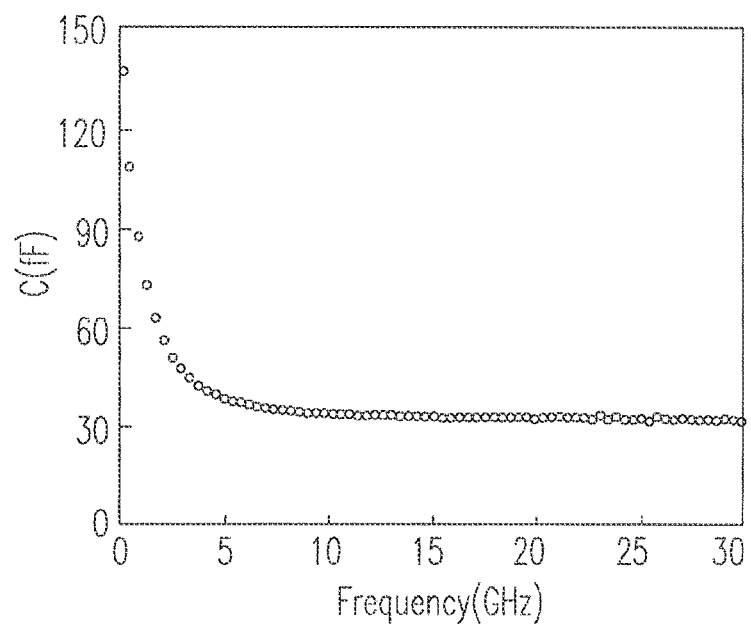
FIG. 1(d) is a diagram showing the measured capacitance value versus the signal frequency.

Please refer to FIG. 1(a), which is a diagram showing a semiconductor structure according to one embodiment of the present disclosure. As shown in FIG. 1(a), the semiconductor structure 1 includes a floating substrate 11, a through-silicon via (TSV) 12, a liner 16 connected to the through-silicon via 12, an electrical device 14 and a grounded capacitor 15. The grounded capacitor 15 includes a metal layer 151, a semiconductor layer 153 which is connected to the floating substrate 11, and a dielectric layer 152 disposed between the metal layer 151 and the semiconductor layer 153, wherein the semiconductor layer 153 is induced by applying an AC/DC signal 154 to the metal layer 151. Typically, a coupled capacitor 17, for example, would be formed between the TSV 12 and the floating substrate 11 both having conductive characteristics, since the liner 16 disposed between the TSV 12 and the floating substrate 11 has a non-conductive characteristic. Further, if a ground is provided in the semiconductor structure 1 which serves as a testkey to operate in a radio frequency, then the S-parameters of the components of the semiconductor structure 1 can be obtained, so that the RLC (Resistance-Inductance-Capacitance) characteristics of the components of the semiconductor structure 1 can be evaluated after implementing the well-known S-parameter transformation method where an admittance matrix describing the behavior of a corresponding circuit network simulating the components of the semiconductor structure 1 would be utilized. Therefore, since the grounded capacitor 15 is grounded, a necessary ground definition for the floating substrate 11 can be provided when the semiconductor structure 1 serving as a testkey operates at a radio frequency, so as to measure the respective S-parameters of the floating substrate 11, the TSV 12 and the coupled capacitor 17. Since the S-parameters can be obtained, the respective RLC characteristics of the floating substrate 11, the TSV 12 and the coupled capacitor 17 can therefore be obtained by implementing the S-parameter transformation method. In FIG. 1(b), there can be seen the measured resistance value of TSV 12 versus the signal frequency having a range from 0 to 30 GHz. In FIG. 1(c), there can be seen the measured inductance value of TSV 12 versus the signal frequency having a range from 0 to 30 GHz. In FIG. 1(d), there can be seen the measured capacitance value of TSV 12 versus the signal frequency having a range from 0 to 30 GHz. The measured resistance, inductance and capacitance values for TSV 12 as a DUT (Device Under Test) can be provided as the reference data for a process designer to realize what improvements have been achieved to manufacture the semiconductor structure 1. The plots of the above RLC characteristics are derived from the exemplary condition that the grounded capacitor 15 and the coupled capacitor 17 are connected in series and that in the implementation of the well-known L-2L de-embedding methodology for de-embedding the TSV 12, a capacitance of 4 pF is included between the metal layer 151 and the semiconductor layer 153 which has a material property different from or identical to that of the floating substrate 11.

Further, as shown in Table 1, in the condition that the coupled capacitor 17 has a predetermined capacitance (C17) of 100 fF, when the capacitance (C15) of the grounded capacitor 15 increases, the error rate of the measured capacitance (meas_C17) of the coupled capacitor 17 decreases. In other words, it could be seen the larger capacitance the grounded capacitor 15 has, the smaller the error rate is. Accordingly, depending on the tolerable error rate for the process designer to implement the semiconductor structure 1, a corresponding capacitance could be decided to be stored between the metal layer 151 and the semiconductor layer 153. According to Table 1, if the tolerable error rate for the process designer is set to be less than 3% (e.g. 2.44%), a corresponding capacitance equal to or higher than 4000 fF could be decided to be stored between the metal layer 151 and the semiconductor layer 153 of the grounded capacitor 15 which is connected to the coupled capacitor 17 in series. Therefore, based on the relevant circuit principal that a capacitor having a larger capacitance under a given operating frequency would provide a less impedance, when the semiconductor structure 1 is operated at a radio frequency, the degree at which the noise signal 18 from the coupled capacitor 17 affects the electrical device 14 could be decreased to a degree at least within the set tolerable error rate, and there could be a reduced impact on the above plotted RLC characteristics of TSV 12 as a DUT. For storing a predetermined capacitance between the metal layer 151 and the semiconductor layer 153, the dielectric layer 152 could be formed by the low-k material such as a fluorosilicate glass (FSG), an un-doped silicate glass (USG), a silicon nitride or an inter layer dielectric (ILD), and the semiconductor layer 153 could be lightly doped and have a resistance in the range of 1~1.7 ohm, 10~30 ohm, or 5~100 ohm. Further, depending on the applications of the semiconductor structure 1, the radio frequency at which the semiconductor structure 1 is operated can be in the range of such as 0.1~100 GHz, the electrical device 14 can be a metal insulator metal (MIM) capacitor, a metal oxide metal (MOM) capacitor, an inductor, a MOSFET, or a MOS capacitor, and the floating substrate 11 can be a lightly doped n-type or p-type substrate.

TABLE 1

| C15 (fF) | C17 (fF) | Meas_C17 (fF) | Error rate (%) |
|---|---|---|---|
| 200 | 100 | 66.67 | 33.33 |
| 1000 | 100 | 90.91 | 9.09 |
| 2000 | 100 | 95.24 | 4.76 |
| 4000 | 100 | 97.56 | 2.44 |
| 12000 | 100 | 99.17 | 0.83 |

Figure 2:
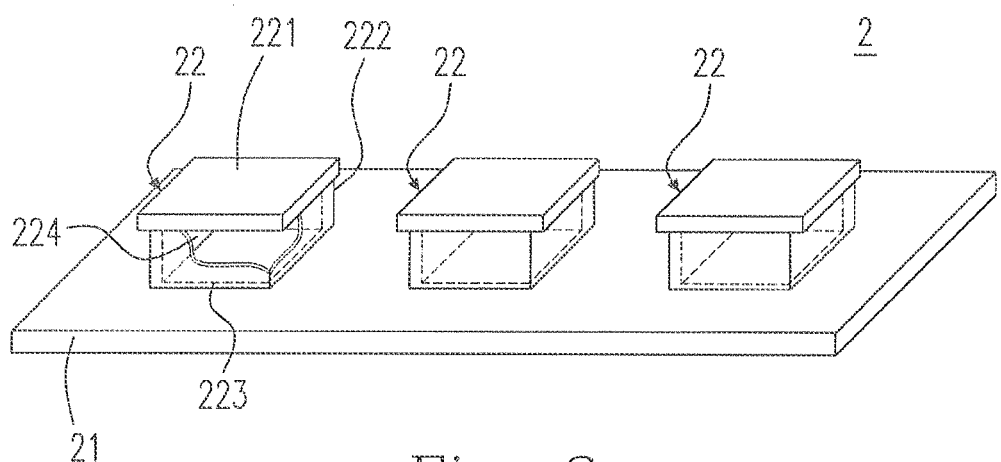
FIG. 2 is a diagram showing a metal structure alternative to the metal layer of the semiconductor structure of FIG. 1(a)

Please refer to FIG. 2, which is a diagram showing a metal structure 2 as an alternative to the metal layer 151 of the semiconductor structure 1 of FIG. 1(a). As shown in FIG. 2, the metal structure 2 includes at least a structure unit 22 and a first metal layer 21. According to the required design rules for manufacturing the semiconductor structure 1, the semiconductor structure 1 can be implemented in such a way that the structure unit 22 includes a second metal layer 221, a hole 223 formed in the first metal layer 21, and a via structure 222 including an empty space 224 and disposed between the hole 223 and the second metal layer 221, and that each of the first metal layer 21 and the second metal layer 221 parallel thereto includes the material of Cu, Al, AlCu or poly-Si.

Figure 3:
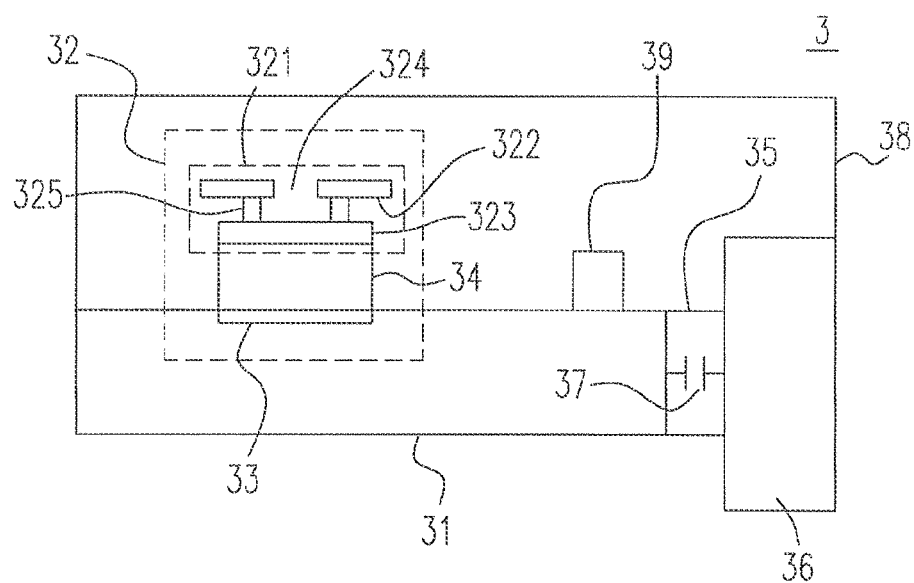
FIG. 3 is a diagram showing a semiconductor structure according to another embodiment of the present disclosure.

Please refer to FIG. 3, which is a diagram showing a semiconductor structure according to another embodiment of the present disclosure. In this embodiment, the semiconductor structure is an RF IC 3. The RF IC 3 includes an electrical device 39, a floating substrate 31, a TSV 36, a liner 35 which is disposed between the TSV 36 and the floating substrate 31 and can be an oxide layer, a dielectric structure 38 including a dielectric part 34 and connected to the floating substrate 31, and a capacitor 32 including a semiconductor layer 33, and a grounded conductive piece 321, wherein the electrical device 39 and the grounded conductive piece are incorporated into the dielectric structure 38. Further, it can be seen that the grounded conductive piece 321 is spaced from the floating substrate 31, so that the dielectric part 34 can be disposed therebetween. The grounded conductive piece 321 includes a first metal layer 323, a second metal layer 322 parallel to the first metal layer 323, and at least a via structure 325 disposed between the first metal layer 323 and the second metal layer 322. The first metal layer 323 can be a gate metal layer, and is closer to the floating substrate 31 than the second metal layer 322 which could comprise the material of Cu, Al, AlCu, or poly-Si. The second metal layer 322 includes a hole 324. Typically, a coupled capacitor 37 would be formed between the TSV 36 and the floating substrate 31 both having conductive characteristics, since the liner 35 disposed between the TSV 36 and the floating substrate 31 has a non-conductive characteristic. Since the conductive piece 321 is grounded, when the RF IC 3 is operated at a radio frequency, a noise signal (not shown) from the coupled capacitor 37 can be picked up by the capacitor 32 so that the electrical device 39 is not affected by the noise signal. For picking up the noise signal, the capacitance equal to or higher than 4 pF or in the range of 1 pF 10 pF is stored between the conductive piece 321 and the semiconductor layer 33. For having the capacitance equal to or higher than 4 pF or in the range of 1 pF~10 pF, the dielectric part 34 could be formed by the low-k material such as a fluorosilicate glass (FSG), an un-doped silicate glass (USG) or a silicon nitride, and the semiconductor layer 33 could be lightly doped and have a resistance in the range of 1~1.7 ohm, 10~30 ohm, or 5~100 ohm.

Figure 4:
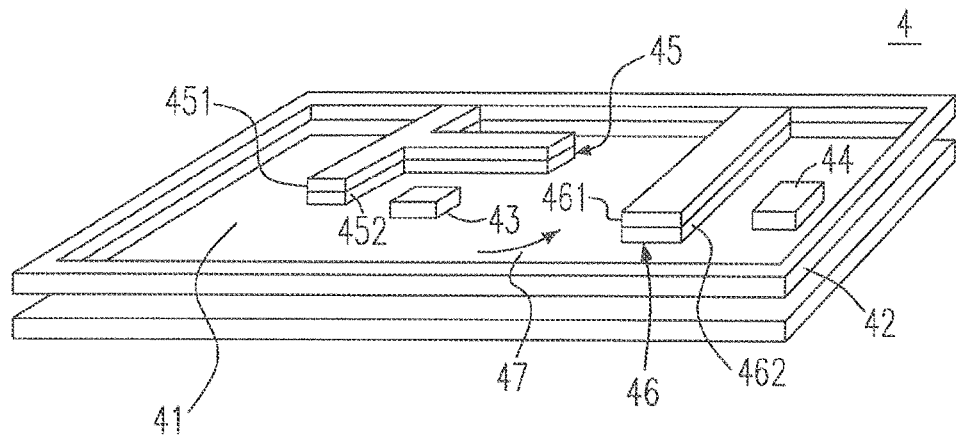
FIG. 4 is a diagram showing a semiconductor structure according to a further embodiment of the present disclosure.

Please refer to FIG. 4, which is a diagram showing a semiconductor structure 4 according to a further embodiment of the present disclosure. In the semiconductor structure 4 having a seal ring 42 which can prevent an IC package (not shown) from cracking when the semiconductor structure 4 is incorporated into the IC package, a floating substrate 41, a first electrical device 43, a second electrical device 44, at least a first capacitor 45 and at least a second capacitor 46 are included. The first capacitor 45 includes a first metal structure 451, a first semiconductor layer (not shown) connected to the floating substrate 41, and a first dielectric layer 452 disposed between the first semiconductor layer and the first metal structure 451, wherein the first metal structure 451 is a depletion region on the floating substrate 41. The second capacitor 46 includes a second metal structure 461, a second semiconductor layer (not shown) connected to the floating substrate 41, and a second dielectric layer 462 disposed between the second semiconductor layer and the second metal structure 461. For meeting the configuration requirements of the semiconductor structure 4, the implementation could be made in such a way that the first semiconductor structure 451 has a T shape and the second semiconductor structure 461 has a rectangular shape. The first metal structure 451 and the second metal structure 461 are both connected to the seal ring 42 for being grounded, so as to prevent a noise signal 47 from affecting the first electrical device 43 and the second electrical device 44. On the other hand, depending on the applications of the semiconductor structure 4, the radio frequency at which the semiconductor structure 4 is operated can be in the range of such as 0.1 GHz~100 GHz, each of the first and second electrical devices 44-45 can be implemented as a metal insulator metal (MIM) capacitor, a metal oxide metal (MOM) capacitor, an inductor, a MOSFET, or a MOS capacitor, each of the first and second semiconductor layer could be formed by a p-well/n-well layer or a p/n doped layer, and the floating substrate can be a lightly doped n-type or p-type substrate 41.

Figure 5:
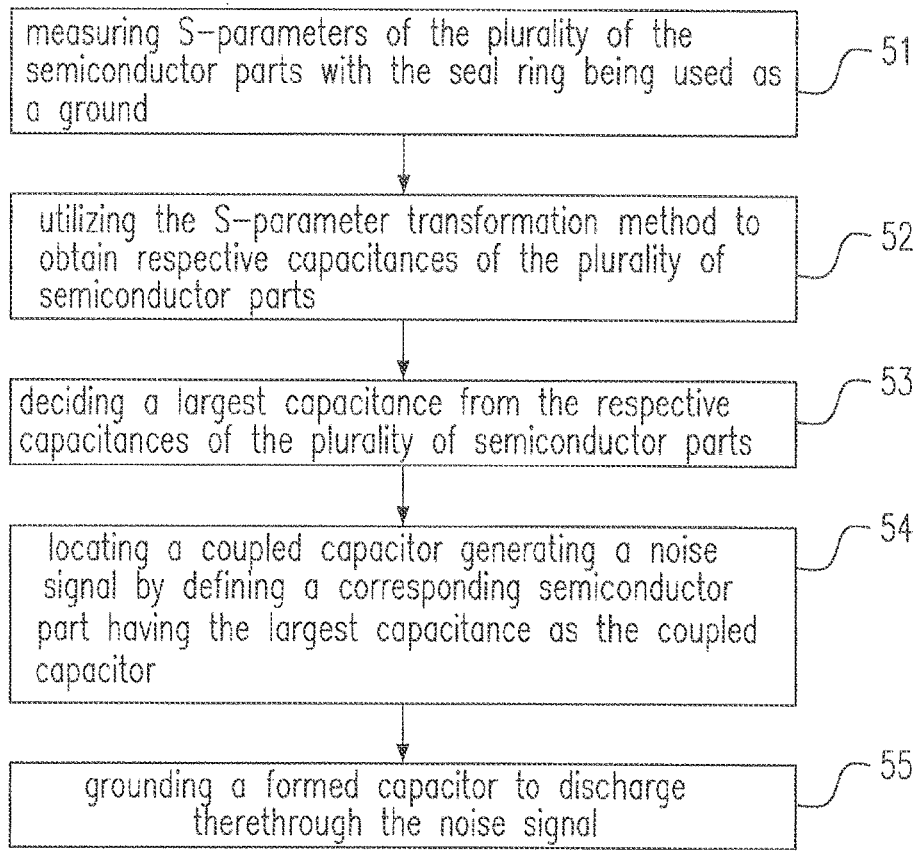
FIG. 5 is a flow chart of a method of manufacturing a semiconductor structure according to one embodiment of the present disclosure.

Please refer to FIG. 5, which is a flow chart of a method of manufacturing a semiconductor structure including a plurality of semiconductor parts and a seal ring according to one embodiment of the present disclosure. The method includes the steps of measuring S-parameters of the plurality of the semiconductor parts with the seal ring being used as a ground (step 51), utilizing the S-parameter transformation method to obtain respective capacitances of the plurality of semiconductor parts (step 52), deciding a largest capacitance from the respective capacitances of the plurality of semiconductor parts (step 53), locating a coupled capacitor generating a noise signal by defining a corresponding semiconductor part having the largest capacitance as the coupled capacitor (step 54), and grounding a formed capacitor to discharge therethrough the noise signal (step 55). In the step 51, a commercial available network analyzer such as a power network analyzer (PNA) or a vector network analyzer (VNA) could be utilized for measuring the S-parameters. In the S-parameter transformation method of the step 52, as an example, an admittance matrix would be established for describing the behavior of a circuit network simulating the semiconductor structure, and the respective capacitances could be derived by dividing the imaginary part of a corresponding element of the admittance matrix by 2 πf, wherein f is an operating frequency at which the semiconductor structure operates. The formed capacitor has but is not limited to the structure of the grounded capacitor 15 shown in FIG. 1(a).

In accordance with one embodiment of the present disclosure, a semiconductor structure is provided. The semiconductor structure comprises a floating substrate and a capacitor grounded and connected to the floating substrate.

In accordance with another embodiment of the present disclosure, a semiconductor structure is provided. The semiconductor structure comprises a floating substrate and a conductive piece spaced from the floating substrate to form a capacitor, wherein the conductive piece is grounded.

In accordance with a further embodiment of the present disclosure, a method of manufacturing a semiconductor structure is provided. The method comprises locating a coupled capacitor generating a noise signal and grounding a formed capacitor to discharge therethrough the noise signal.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A semiconductor structure, comprising:
 a floating substrate having a semiconductor layer; and
 a first metal layer having a grounded T-shaped member in a plane parallel to a top surface of the floating substrate;
 a dielectric layer between the semiconductor layer of the floating substrate and the T-shaped member, to form a capacitor;

at least one through-silicon-via (TSV) penetrating the floating substrate, such that the TSV is configured to provide a noise signal to the floating substrate when an integrated circuit (IC) including the semiconductor structure is operated at a radio frequency; and at least one electrical device on the floating substrate configured to operate at the radio frequency, wherein the at least one electrical device is between the TSV and the grounded T-shaped member.

2. A semiconductor structure as claimed in claim 1, wherein the semiconductor layer is electronically connected to the floating substrate.

3. A semiconductor structure as claimed in claim 1, wherein the capacitor is grounded for preventing the noise signal from affecting the at least one electrical device.

4. A semiconductor structure as claimed in claim 1, further comprising a seal ring, wherein the capacitor includes a metal structure electrically connected to the seal ring for being grounded.

5. A semiconductor structure as claimed in claim 1, wherein the floating substrate has resistance-inductance-capacitance (RLC) characteristics, and the capacitor is grounded for estimating the RLC characteristics.

6. A semiconductor structure as claimed in claim 1, wherein the semiconductor structure is an RF IC.

7. A semiconductor structure as claimed in claim 1, wherein the T-shaped member is grounded for preventing the noise signal from affecting the at least one electrical device.

8. A semiconductor structure as claimed in claim 1, further comprising a seal ring, wherein a conductive piece is electrically connected to the seal ring for being grounded.

9. A semiconductor structure as claimed in claim 1, wherein the T-shaped member has two portions thereof adjacent to the at least one electrical device.

10. A semiconductor structure as claimed in claim 1, wherein the T-shaped member and the floating substrate have one of capacitances equal to and higher than 4 pF stored therebetween.

11. The semiconductor structure of claim 1, wherein the semiconductor structure further comprises the at least one through-silicon-via (TSV) penetrating the floating substrate, the TSV being separated from a conductive piece by the substrate, the TSV having a capacitive coupling to the floating substrate, such that the TSV is configured to provide the noise signal to the floating substrate when an integrated circuit (IC) including the semiconductor structure is operated at the radio frequency, the capacitive coupling between the floating substrate and ground sufficient for discharging configured to discharge the noise signal when the IC is operated at the radio frequency.

12. A semiconductor structure, comprising:
a floating substrate having a semiconductor layer;
a grounded capacitor grounded and electrically connected to the floating substrate, wherein the grounded capacitor includes a first metal layer having a T-shaped portion in a plane parallel to a top surface of the floating substrate, the T-shaped portion electrically connected to ground, and a dielectric layer between the semiconductor layer of the floating substrate and the T-shaped member;

at least one through-silicon-via (TSV) penetrating the floating substrate, the TSV being separated from the grounded capacitor by the substrate, the TSV having a liner that provides a capacitive coupling to the floating substrate, such that the TSV is configured to provide a noise signal to the floating substrate when an integrated circuit (IC) including the semiconductor structure is operated at a radio frequency;

at least one electrical device on the floating substrate between the grounded capacitor and the TSV; and wherein the capacitive coupling between the floating substrate and ground is configured to discharge the noise signal when the IC is operated at the radio frequency and avoiding an affect by the noise signal on the at least one electrical device.

13. The semiconductor structure of claim 12, wherein the at least one electrical device is a high frequency device configured for operation at the radio frequency.

14. The semiconductor structure of claim 12, further comprising a seal ring, wherein
the T-shaped portion is electrically connected to the seal ring for being grounded, and two portions of the T shape are adjacent to the at least one electrical device.

15. A semiconductor structure, comprising:
a floating substrate having a semiconductor layer;
a grounded seal ring;
a grounded capacitor grounded and electrically connected to the floating substrate, wherein the grounded capacitor includes a metal structure electrically connected to the seal ring for being grounded, the metal structure having a T shape in a plane parallel to a top surface of the floating substrate and a dielectric layer between the semiconductor layer of the floating substrate and the T-shaped member, and at least a portion of the T shape is near the at least one electrical device;

at least one through-silicon-via (TSV) penetrating the floating substrate, the TSV being separated from a first metal layer by the substrate, the TSV being without a conductive coupling to the grounded capacitor, and the TSV having a liner that provides a capacitive coupling to the floating substrate, such that the TSV is configured to provide a noise signal to the floating substrate when an integrated circuit (IC) including the semiconductor structure is operated at a radio frequency; and at least one electrical device on the floating substrate between the grounded capacitor and the TSV, the at least one electrical device configured to operate at the radio frequency, wherein the grounded capacitor provides a capacitive coupling, between the floating substrate and ground, sufficient for discharging configured to discharge the noise signal when the IC is operated at the radio frequency.

* * * * *

UNITED STATES PATENT AND TRADEMARK OFFICE
CERTIFICATE OF CORRECTION

Page 1 of 1

PATENT NO. : 9,923,101 B2
APPLICATION NO. : 13/615503
DATED : March 20, 2018
INVENTOR(S) : Hsiao-Tsung Yen et al.

It is certified that error appears in the above-identified patent and that said Letters Patent is hereby corrected as shown below:

In the Claims

Claim 15, Column 8, Line 55, delete "sufficient for discharging"

Signed and Sealed this
Eighth Day of May, 2018

Andrei Iancu
*Director of the United States Patent and Trademark Office*